United States Patent
Ngo et al.

[11] Patent Number: 6,060,404
[45] Date of Patent: *May 9, 2000

[54] IN-SITU DEPOSITION OF STOP LAYER AND DIELECTRIC LAYER DURING FORMATION OF LOCAL INTERCONNECTS

[75] Inventors: Minh Van Ngo, Union City; Darin A. Chan, Campbell, both of Calif.; Sey-Ping Sun, Austin, Tex.; Terri Kitson, San Jose; John Caffall, Fremont, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/924,130

[22] Filed: Sep. 5, 1997

[51] Int. Cl.[7] .................................................. H01L 21/72
[52] U.S. Cl. ............................................................. 438/778
[58] Field of Search .............................................. 438/778

[56] References Cited

U.S. PATENT DOCUMENTS

| | | |
|---|---|---|
| 5,387,535 | 2/1995 | Wilmsmeyer . |
| 5,391,520 | 2/1995 | Chen et al. . |
| 5,453,400 | 9/1995 | Abernathey et al. . |
| 5,489,797 | 2/1996 | Chan et al. . |
| 5,516,726 | 5/1996 | Kim et al. . |
| 5,521,106 | 5/1996 | Okabe . |
| 5,563,096 | 10/1996 | Nasr . |
| 5,589,415 | 12/1996 | Blanchard . |
| 5,621,232 | 4/1997 | Ohno . |
| 5,621,235 | 4/1997 | Jeng . |

FOREIGN PATENT DOCUMENTS

| | | |
|---|---|---|
| 0 661 732 A2 | 7/1995 | European Pat. Off. . |
| 01019760 | 1/1989 | Japan . |
| WO/97/18585 | 5/1997 | WIPO . |

OTHER PUBLICATIONS

Stanley Wolf Silicon Processing for the VSLI ERA vol. 2 Lattice Press pp. 161, 194–196, 199–203, 1990.

J. S. Logan et al., "Oxide–nitride insulator process for memory metallization;large–small via etch sequence", IBM Technical Disclosure Bulletin, vol. 23, No. 7B, Dec. 1980, pp. 3210–3211.

Primary Examiner—Charles Bowers
Assistant Examiner—David S Blum

[57] ABSTRACT

An in-situ deposition method allows for the forming of a dielectric layer suitable for use in forming a conductive path in a semiconductor wafer. The method includes depositing a thin $SiO_xN_y$ stop layer on top of a semiconductor wafer within a chemical vapor deposition (CVD) reactor chamber having a low pressure, maintaining the low pressure following the deposition of the $SiO_xN_y$ stop layer, and then depositing a thick TEOS oxide dielectric layer on the $SiO_xN_y$ stop layer within the CVD reactor chamber. The in-situ deposition process reduces outgassing defects that would normally form at the interface between the SiON stop layer and the TEOS oxide dielectric layer.

19 Claims, 2 Drawing Sheets

IN-SITU DEPOSITION OF STOP LAYER AND DIELECTRIC LAYER DURING FORMATION OF LOCAL INTERCONNECTS

TECHNICAL FIELD

The present invention relates to semiconductor devices and manufacturing processes, and more particularly to methods for providing local interconnections between two or more regions within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit's performance. Accordingly, as the density of the circuits increase there is a continuing need for more efficient, effective and precise processes for forming smaller local interconnects.

With this in mind, FIG. 1 depicts a cross-section of a portion 10 of a prior-art semiconductor wafer having a stop layer 22 and a dielectric layer 26 as prepared for local interconnect processing using conventional deposition processes. As shown, portion 10 includes a substrate 12 in which one or more devices have been formed. By way of example, portion 10 includes a gate 16 that is part of a field effect transistor having a source and a drain region formed within substrate 12, as is known in the art. As shown, gate 16, which is typically a conductive material or a semiconductive material, such as, for example, a doped polycrystalline silicon (referred to hereinafter as polysilicon), is formed on a gate oxide 14 that has been formed on substrate 12. Oxide spacers 20 have been added to the vertical sidewalls of gate 16 and the exposed top surface of gate 16 has a conductive silicide 18 formed thereon. Stop layer 22, which is a dielectric material, such as, for example, silicon nitride (e.g., $Si_3N_4$), has been deposited over the exposed surfaces of portion 10 using a stop layer deposition process. Dielectric layer 26 has been deposited over stop layer 22 using a conventional deposition process.

Although stop layer 22 and dielectric layer 26 are both dielectric materials, preferably they are different enough in structure such that subsequent etching processes are capable of etching through dielectric layer 26 while essentially stopping at stop layer 22 (frequently referred to as an "etch stop" layer), thereby avoiding the possibility of etching into substrate 12 and the device regions formed therein. Without stop layer 22, the etching process would likely extend too far into substrate 12 which could damage existing structures therein and/or cause circuit failures by introducing a electrical shorts and other similar problems after the local interconnect has been completed. Thus, as is known in the art, a stop layer provides improved process control in the formation of local interconnects that are formed using damascene techniques. For example, if dielectric layer 26 is a TEOS oxide layer and stop layer 22 is a SiON layer, then a subsequent oxide etching process that exhibits a high selectivity to SiON can be used to remove selected portions of dielectric layer 26.

As depicted in FIG. 1, there is also shown several defects, such as defect 24, that tend to form at the interface between stop layer 22 and dielectric layer 26. Defect 24 is typically created by outgassing effects that occur at the interface, during the conventional deposition processes. Defect 24, in certain circumstances, creates topology problems in subsequent layers, such as, dielectric layer 26 that includes a bump 28 above defect 24. In some integrated circuits, defect 24 changes the electrical properties of the various layer, materials, and/or device structure, which affects performance and/or causes the circuit/device to fail during operation. In other circumstances, bump 28 and/or defect 24 present topology problems that hinder or otherwise harm subsequently formed overlying layers, and/or reduce the capabilities of subsequently employed defect inspection techniques/tools to provide an accurate assessment of the fabricated structure. Thus, as illustrated in FIG. 1, there is also a need for methods for reducing or eliminating defects, such as defect 24, during the formation of two or more dielectric layers which are subsequently patterned to form local interconnects.

SUMMARY OF THE INVENTION

The present invention provides an in-situ deposition process for forming a stop layer and a dielectric layer which are subsequently etched to create contacts and/or vias for use as local interconnects. The stop layer and dielectric layer allow for more precise process control during the damascene process. As a result, the in-situ deposition process of the present invention provides better process control, reduces processing failures, speeds production, and reduces manufacturing costs.

Thus, in accordance with one embodiment of the present invention, there is provided a method for forming a local interconnect in a semiconductor wafer. The method includes forming a device within a semiconductor wafer substrate, using an in-situ deposition process to deposit a first layer and a second layer of different dielectric materials over the device, and forming a conductive path that extends through both the first and second layers to the underlying device(s). In certain embodiments, the in-situ deposition process includes using a chemical vapor deposition (CVD) technique to deposit a first layer of silicon oxynitride (e.g., $SiO_xN_y$, hereinafter referred to simply as SiON) and a second layer of tetraethylorthosilicate (TEOS) oxide.

The method according to other embodiments also includes maintaining a low pressure within a reactor chamber during the deposition of the first layer and until the deposition of the second layer begins. In other embodiments of the present invention, the method includes creating an etched opening by first etching through a selected portion of the second layer and stopping at the first layer, and then extending the etched opening by further etching through an exposed portion of the first layer. Once the etched opening has been created, the method includes filling the extended etched opening with an electrically conductive material.

In accordance with yet another embodiment of the present invention there is provided an in-situ deposition method for forming a dielectric layer, suitable for use in forming a conductive path in a semiconductor wafer. This method includes depositing a thin SiON stop layer on a semiconductor wafer substrate within a chemical vapor deposition (CVD) reactor chamber having a low pressure, maintaining the low pressure following the deposition of the SiON stop layer, and then depositing a thick TEOS oxide dielectric layer on the SiON stop layer within the CVD reactor chamber.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the features of the present invention.

In accordance with an embodiment of the present invention, there is provided an in-situ deposition process for use in fabricating a dual-layer dielectric, including a stop layer and a dielectric layer. The dual-layer dielectric, which includes a thick dielectric layer over a thin stop layer, is advantageously used in the formation of local interconnects within an integrated circuit manufacturing process. The in-situ deposition process eliminates the need to relocate or otherwise move a semiconductor wafer between different process tools. This helps to reduce process cycle times and thereby increases throughput. Furthermore, the in-situ deposition process tends to decrease—and in many cases significantly eliminates—defects, such as the outgassing defects that typically form between the stop layer and dielectric layer in conventional separate deposition processes. As such, the present invention provides better process control over the local interconnect etching and fabrication process, reduces the likelihood of damaging the semiconductor wafer/devices, speeds production, and reduces manufacturing costs.

Figure 1:
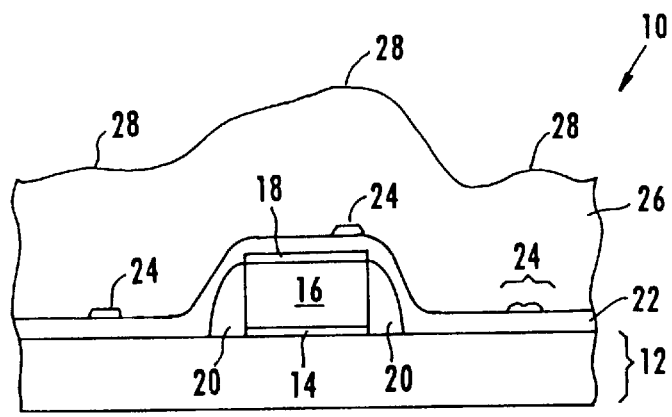
FIG. 1 depicts a cross-section of a portion of a semiconductor wafer having a stop layer and a dielectric layer as prepared for local interconnect processing using separate deposition processes.
Figure 2:
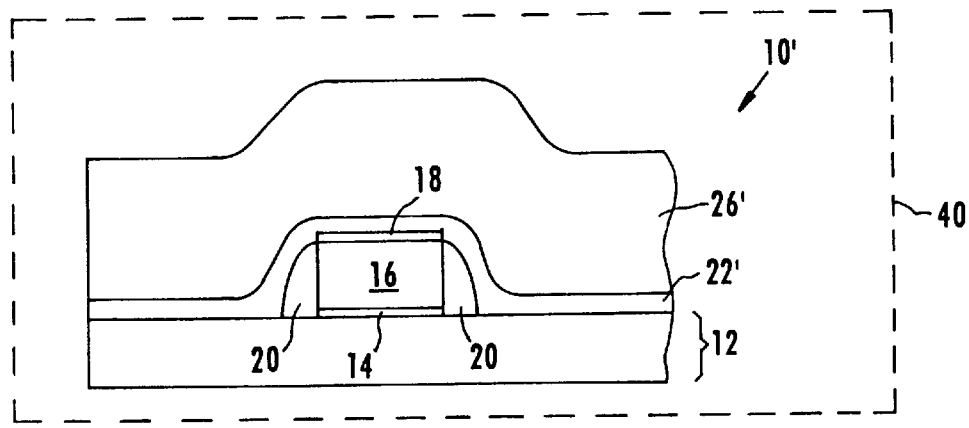
FIG. 2 depicts a cross-section of a portion of a semiconductor wafer having a stop layer and a dielectric layer as prepared for local interconnect processing using an in-situ deposition process, in accordance with an embodiment of the present invention.
Figure 3:
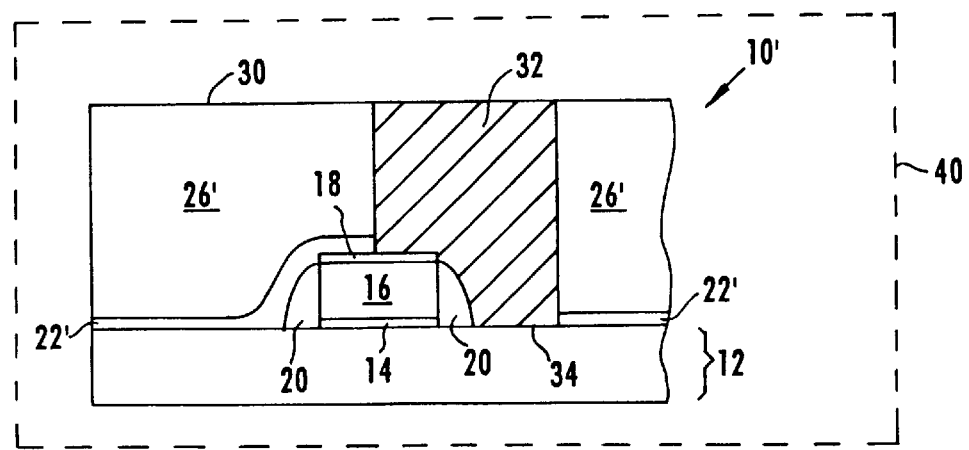
FIG. 3 depicts a cross-section of the portion in FIG. 2 following complete formation of a local interconnect that extends through the stop layer and dielectric layer, in accordance with an embodiment of the present invention.

FIG. 2 depicts an exemplary cross-section of an improved portion 10' of a semiconductor wafer having a stop layer 22' and a dielectric layer 26' as prepared for local interconnect processing using an in-situ deposition process, in accordance with one embodiment of the present invention. As shown, the interface between stop layer 22' and dielectric layer 26' is free from defects, such as defect 24 of FIG. 1. In accordance with an embodiment of the present invention, the in-situ deposition process which forms both layers (i.e., 22' and 26') significantly prohibits, if not entirely eliminates, formation of such defects by maintaining, throughout the in-situ deposition process, a low pressure environment in a deposition reactor chamber and, if applicable, in a load lock chamber coupled to the reactor chamber. In FIGS. 2 and 3, the deposition reaction chamber is schematically indicated by dashed lines and reference numeral 40. Because of the low pressure environment most, if not all, of the outgassing and similar defect causing mechanisms are either avoided or removed from stop layer 22' prior to the deposition of dielectric layer 26'.

The in-situ deposition process of the present invention is described below as part of a local interconnect formation process (e.g., see FIG. 4). However, before describing this local interconnect formation process, the resulting local interconnect structure is first described for exemplary portion 10' as depicted in FIGS. 2 and 3.

In an exemplary embodiment of the present invention, substrate 12 includes a heavily-doped silicon substrate layer that is approximately 2 mm thick and on which there is grown a lightly-doped epitaxial (epi) layer that is approximately 4 $\mu$m thick. Gate oxide layer 14 is approximately 55 Å thick, and gate 16, which is preferably made of polycrystalline silicon, is approximately 1,700 Å thick. In this embodiment, silicide 18 is a thin titanium silicide layer formed on the exposed top surface of gate 16.

At this stage, the semiconductor wafer having portion 10' is then prepared and placed in a deposition reactor chamber 40 within a conventional deposition system. By way of example, a chemical vapor deposition (CVD) system or an enhanced CVD system, as is known in the art, can be used, and provides the capability to deposit the materials of stop layer 22' and dielectric layer 26' in accordance with the present invention.

Thus, for example, in an exemplary embodiment of the present invention a Novellus Concept One™ or Concept Two™ CVD system, available from Novellus Systems, Inc., of San Jose, Calif. is used to deposit in-situ stop layer 22' and dielectric layer 26'. Stop layer 22', in this embodiment, is a thin film or layer of SiON that is approximately 800 Å thick. Dielectric layer 26', in this embodiment, is a layer of tetraethylorthosilicate (TEOS) oxide. Dielectric layer 26', as shown in FIG. 2, is a conformal layer that is deposited until approximately 12000 Å thick. In a subsequent step, the exposed top surface of dielectric layer 26' is planarized down, for example, using an oxide chemical-mechanical polish (CMP), to a thickness of approximately 6500 to 9500 Å (see FIG. 3).

The use of a Novellus system to deposit a TEOS oxide layer, such as dielectric layer 26', is well known; as are process materials and parameters (e.g., the deposition recipe). However, providing a compatible and reliable in-situ SiON deposition process is not known. Thus, in accordance with the present invention, a SiON deposition process has been developed for use in-situ with a conventional TEOS oxide deposition process.

The SiON deposition process described below, in accordance with the present invention, is used to deposit SiON on a semiconductor wafer as described above within a Novellus Concept One™. However, those skilled in the art will recognize that the various parameters associated with the SiON and/or the in-situ deposition process are adjustable for differing arrangements, semiconductor wafers, layer stacks, layer materials, and/or deposition systems/apparatus. As such, it is recognized that the present invention can be practiced with or without all of the parameters being adjusted or provided as described herein.

The SiON deposition process uses a mixture of $SiH_4/N_2/N_2O$ gasses to form stop layer 22'. By way of example, in a preferred embodiment, the SiON deposition process includes a mixture of approximately 283 +/– 28 sccm of $SiH_4$ gas, approximately 8,000 +/– 800 sccm of $N_2$ gas, and 160 +/– 16 sccm of $N_2O$ gas. Those skilled in the art will recognize that an approximate ratio of these gasses, as set out herein, can be used to adapt the present invention to other systems/apparatus.

In addition, in a preferred embodiment, a high frequency power supply is set to provide approximately 250 +/– 50 Watts of power to the reactor chamber, and the low frequency power supply is set to provide approximately 210 +/– 40 Watts of power to the reactor chamber. Furthermore, the temperature of the semiconductor wafer is maintained at approximately 400° +/–25° C. during the SiON deposition process which lasts approximately 5 +/– 2 seconds.

Furthermore, the pressure within the reactor chamber (and the load lock chamber, if applicable) is one important feature of the present invention. The pressure, for example, in the exemplary embodiment above is maintained at approximately 3.0 +/– 0.5 Torr during the SiON deposition process. Following the SiON deposition, wafers are then held in a load lock chamber at approximately 3.3 +/– 0.5 Torr. Moreover, following the SiON (i.e., stop layer 22') deposition, the pressure is maintained or held at about this low pressure at least until the TEOS oxide deposition process begins. At this stage, the pressure is then adjusted, as required, to deposit dielectric layer 26'. Thus, in this manner, the wafer is essentially held in a low pressure environment throughout the in-situ deposition process. The low pressure environment advantageously helps to avoid the formation of defects, such as defect 24 of FIG. 1.

Having formed stop layer 22' and dielectric layer 26' using the in-situ deposition method of the present invention, portion 10' is now ready for further processing, such as the formation of a local interconnect 32 as depicted in FIG. 3. As shown, portion 10' of FIG. 3 has had dielectric layer 26' planarized and patterned and etched (along with stop layer 22') to allow for a conductive material, such as, a metal, for example tungsten (W), to be deposited within an etched opening to provide an electrical contact to one or more devices and/or device regions. The formation of local interconnects using damascene processes, such as these, is known to those skilled in the art.

Figure 4:
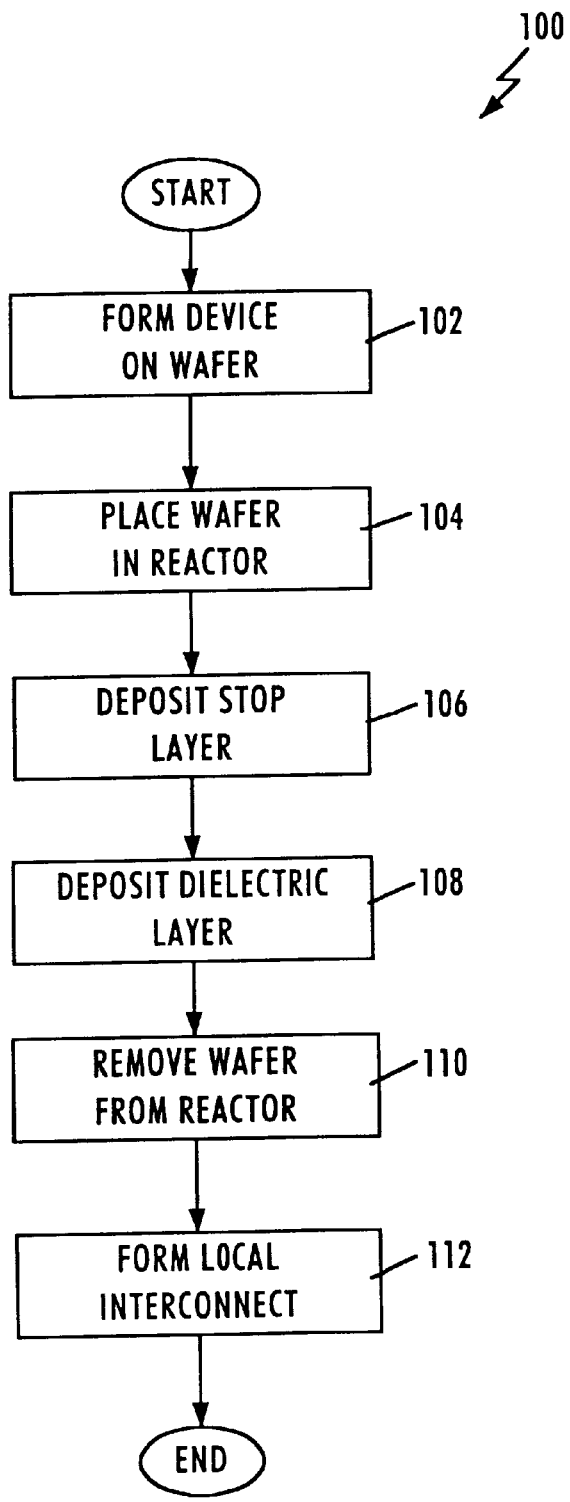
FIG. 4 depicts a flow-chart of a method for forming the local interconnect of FIG. 3 using an in-situ deposition process, in accordance with an embodiment of the present invention.

FIG. 4 depicts a flow chart of a method 100 for forming a local interconnect, such as local interconnect 32 of FIG. 3, using an in-situ deposition process in accordance with an embodiment of the present invention. Method 100 includes forming a device on a semiconductor wafer, in step 102, using conventional semiconductor device fabrication processes. By way of example, portion 10' of FIG. 2 without stop layer 22' and dielectric layer 26' represents an exemplary wafer having such a device. In step 104, the wafer is placed in a CVD or a like deposition system. Next, in step 106, a stop layer of SiON is deposited, in accordance with the recipe(s) of the present invention, on the wafer, followed by a dielectric layer of TEOS oxide in step 108. The wafer remains in the deposition system's reactor chamber 40 during steps 106 and 108, and the pressure within the reactor chamber 40 is kept significantly low during these steps. In step 110, the wafer is removed from the reactor. By way of example, portion 10' of FIG. 2 depicts an exemplary wafer as a result of step 110. The wafer is then processed, in step 112, to form at least one local interconnect using conventional damascene techniques. Thus, for example, portion 10' of FIG. 3 depicts an exemplary local interconnect as formed as a result of step 112.

In certain other embodiments of the present invention, method 100 is further adapted for use with a reactor chamber having an associated load lock chamber for holding a plurality of wafers. In this embodiment, step 106 further includes temporarily holding the wafer in the load lock chamber while maintaining a substantially low pressure in the load lock chamber, for example, a pressure of less than approximately 5 Torr, and more preferably between approximately 2.8 and 3.8 Torr. This embodiment, therefore, allows for the processing of a plurality of wafers with method 100 by maintaining a substantially low pressure environment throughout the cycling from one wafer to the next wafer.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a local interconnect in a semiconductor substrate, the method comprising the sequential steps of:

forming a device within the semiconductor substrate;

successively depositing, in a common deposition space maintained at a low pressure, a first, etch stop layer of a first dielectric material over the device and a second layer of a second dielectric material overlying and in contact with the first layer, whereby defect formation in the first and/or second dielectric layers due to outgassing of the first layer is substantially reduced or eliminated; and forming a conductive path that extends through the first and second layers to the device by a process comprising:

creating an etched opening by etching through a selected portion of the second layer by means of an etchant which stops at the first layer;

extending the etched opening by further etching through an exposed portion of the first layer and stopping on the device within the substrate; and filling the extended etched opening with an electrically conductive material.

2. The method as recited in claim 1, wherein the step of depositing includes depositing at least one of the first and second dielectric layers by chemical vapor deposition (CVD).

3. The method as recited in claim 2, wherein the first layer comprises $SiO_xN_y$.

4. The method as recited in claim 3, wherein the second layer comprises TEOS oxide.

5. The method as recited in claim 4, wherein the step of depositing includes placing the semiconductor wafer in a deposition space comprising a reactor chamber and maintaining a low pressure within the reactor chamber of approximately 2.5 to 3.5 Torr during the deposition of the first layer and the deposition of the second layer.

6. The method as recited in claim 4, wherein the step of depositing further includes placing the semiconductor wafer in a deposition space comprising a reactor chamber and maintaining a low pressure within the reactor chamber of less than about 5 Torr during the deposition of the first layer and the deposition of the second layer.

7. The method as recited in claim 5, comprising supplying a mixture of $SiH_4/N_2/N_2O$ gasses to the reactor chamber during the deposition of the first layer.

8. The method as recited in claim 7, wherein the mixture of $SiH_4/N_2/N_2O$ gasses is provided to the reactor chamber in a ratio based on a mixture of approximately 283 sccm of $SiH_4$ gas, approximately 8,000 sccm of $N_2$ gas, and approximately 160 sccm of $N_2O$ gas.

9. The method as recited in claim 8, wherein the step of depositing further includes maintaining the temperature of the semiconductor wafer at approximately 400 degrees Celsius during deposition of the first layer.

10. The method as recited in claim 3, wherein the first layer comprises $SiO_xN_y$ and has a thickness of approximately 800 Å.

11. The method as recited in claim 4, wherein the second layer comprises TEOS oxide and has a thickness of approximately 12,000 Å.

12. The method as recited in claim 1, wherein the step of forming of a conductive path further includes planarizing the second layer prior to etching through the selected portion of the second layer.

13. An in-situ deposition method for forming a dielectric layer suitable for use in forming a conductive path to an underlying semiconductor substrate, the method comprising the sequential steps of:

depositing a first, $SiO_xN_y$ etch stop layer on a surface of the semiconductor substrate within a deposition reaction chamber having a low pressure therein;

maintaining the semiconductor substrate in the deposition reactor chamber at the low pressure following the deposition of the first, $SiO_xN_y$ etch stop layer; and depositing a second, TEOS oxide dielectric layer overlying and in contact with the first, $SiO_xN_y$ etch stop layer within the deposition reactor chamber while maintaining the low pressure therein, whereby defect formation in the first and/or second layers due to outgassing of the first layer is substantially reduced or eliminated.

14. The in-situ deposition method as recited in claim 13, wherein the low pressure is less than about 5 Torr.

15. The in-situ deposition method as recited in claim 13, wherein the first $SiO_xN_y$ etch stop layer is deposited using a mixture of $SiH_4/N_2/N_2O$ gasses.

16. The in-situ deposition method as recited in claim 15, wherein a ratios of the mixture of $SiH_4/N_2/N_2O$ gasses is based on a preferred mixture of approximately 283 sccm of $SiH_4$ gas, approximately 8,000 sccm of $N_2$ gas, and approximately 160 sccm of $N_2O$ gas.

17. The in-situ deposition method as recited in claim 16, further comprising maintaining the temperature of the semiconductor wafer at approximately 400 degrees Celsius during deposition of the $SiO_xN_y$ stop layer.

18. The in-situ deposition method as recited in claim 13, wherein the first, $SiO_xN_y$ etch stop layer has a thickness of approximately 800 Å.

19. The in-situ deposition method as recited in claim 13, wherein the second TEOS oxide dielectric layer has a thickness of approximately 12,000 Å.

* * * * *